US008086430B2

(12) United States Patent
Thomas (10) Patent No.: US 8,086,430 B2
(45) Date of Patent: Dec. 27, 2011

(54) METHOD TO ACCURATELY POSITION FINITE ELEMENT DUMMIES IN FINITE ELEMENT SIMULATIONS

(75) Inventor: Dylan Thomas, Columbus, OH (US)

(73) Assignee: Honda Motor Co., Ltd., Tokyo (JP)

( * ) Notice: Subject to any disclaimer, the term of this patent is extended or adjusted under 35 U.S.C. 154(b) by 516 days.

(21) Appl. No.: 12/240,643

(22) Filed: Sep. 29, 2008

(65) Prior Publication Data

US 2009/0138250 A1 May 28, 2009

Related U.S. Application Data

(60) Provisional application No. 60/976,213, filed on Sep. 28, 2007.

(51) Int. Cl.
*G06G 7/48* (2006.01)
(52) U.S. Cl. ............................... 703/8; 703/6
(58) Field of Classification Search .............. 703/2, 3, 703/6, 8
See application file for complete search history.

(56) References Cited

U.S. PATENT DOCUMENTS

| | | | |
|---|---|---|---|
| 4,850,877 A | 7/1989 | Mason et al. | |
| 5,018,977 A * | 5/1991 | Wiley et al. | 434/274 |
| 6,904,399 B2 | 6/2005 | Cooper et al. | |
| 6,907,391 B2 * | 6/2005 | Bellora et al. | 703/8 |
| 7,038,700 B2 * | 5/2006 | Kawaguchi et al. | 345/646 |
| 2007/0244679 A1 * | 10/2007 | Namiki et al. | 703/8 |

OTHER PUBLICATIONS

Deter, Thomas et al., "Validation of a Seat-Dummy Simulation Model for Rear-Impact", Jun. 18-21, 2007, Germany Insurance Association—Accident Research, Paper No. 07-0151, The 20$^{th}$ International Technical Conference on the Enhanced Safety of Vehicles Conference (ESV) in Lyon, France.*

Mohan et al., "Development of Detailed Finite Element Dummy Models", Sep. 16, 2007, FHWA/NHTSA National Crash Analysis Center, The George Washington University, United States.*

Golinski, et al. "Finite Element Modeling of Biomechanical Dummies—The Ultimate Tool in Anti-Whiplash Safety Design?", Apr. 16, 2000.*

Kirkpatrick, S.W. et al., "Finite Element Modeling of the Side Impact Dummy (SID)," Human Surrogates: Design, Development & Side Impact Protection, Presented at the 1993 International Congress and Exposition, Mar. 1993, pp. 75-86, SAE Paper No. 930104, SAE Publications, SP-945.

(Continued)

*Primary Examiner* — Paul Rodriguez
*Assistant Examiner* — Cedric D Johnson
(74) *Attorney, Agent, or Firm* — Fenwick & West LLP; Mark E. Duell (57) ABSTRACT

The present invention uses spring models to position a finite element occupant model within a pre-simulation. Initially, a starting position and a final position for the finite element occupant model are determined. A first end of each of a plurality of spring models are attached at a first end to one or more components of the finite element occupant model in its starting position. The motion of the second end of each spring model is prescribed using positioning parameters and/or properties of each spring model are specified using spring parameters so that each attachment point is pulled to its final position through tension on the spring models. The specified positioning parameters and/or spring parameters describe how each spring model repositions the components of the finite element occupant model from the starting position to the final position.

14 Claims, 3 Drawing Sheets

OTHER PUBLICATIONS

Kirkpatrick, S.W. et al., "Development of an LS-DYNA Occupant Model for Use in Crash Analyses of Roadside Safety Features" Proc. of the 2003 TRB 82$^{nd}$ Annual Meeting, Jan. 12-16, 2003, Transportation Review Board, Paper No. TRB2003-0002450, Washington, D.C., USA.

Midoun, D.E., "Development of a Finite Element Based Model of the Side Impact Dummy," Engineering Society for Advancing Mobility Land Sea Air and Space, (SAE International) International Congress and Exposition, Mar. 1-5, 1993, SAE Paper No. 930444, Detroit, Michigan, USA.

* cited by examiner

METHOD TO ACCURATELY POSITION FINITE ELEMENT DUMMIES IN FINITE ELEMENT SIMULATIONS

RELATED APPLICATIONS

This application claims priority, under 35 U.S.C. §119(e), from U.S. provisional application No. 60/976,213, filed on Sep. 28, 2007, which is incorporated by reference herein in their entirety

FIELD OF THE INVENTION

This invention generally relates to driver and vehicle safety and more particularly to positioning a finite element occupant model for a vehicle crash simulation.

BACKGROUND OF THE INVENTION

Finite element occupant models are used to predict the behavior of a vehicle occupant, such as a crash test dummy or a human, in a computer simulation of a vehicular accident. Computer simulation of a vehicular accident using finite element occupant models allows assessment of how a crash affects an occupant without requiring a physical crash test to be conducted. However, to provide accurate data, the finite element occupant model must be properly positioned before simulating a vehicle crash. Proper positioning ensures the finite element occupant model accurately reflects the positioning and behavior of a vehicle occupant, such as a crash test dummy or a human.

Currently, commercial software tools are used to position the finite element occupant model before simulating a vehicle crash. However, these existing software tools often inaccurately simulate joint movement by allowing components connected by a joint to interfere and penetrate each other. These "nodal penetrations" within the finite element occupant models cause the simulation to be inaccurate. These initial penetrations are caused by the existing software tools' inability to account for how real world joint motion deforms or modifies the regions surrounding the joint (e.g., movement of tissue surrounding the knee as the knee bends). To compensate for these nodal penetrations, conventional methods require manual removal of the nodal penetrations from the simulation, which is a time- and labor-intensive process.

Additionally, pre-simulating the position of the finite element occupant model is time-consuming and complicated by the risk of over-constraining the finite element occupant model's movement, causing erroneous pre-simulation results. As different components of the finite element occupant model are connected by joints, the relative motion of these connected components is restricted by the joints. Different types of joints (e.g., spherical, translational, planar, etc.) can be used to connect different components and each joint type differently constrains the relative motion of the connected components. Because component motion is constrained by the joint type, accurate simulation requires precise specification of how components move relative to each other, and inexact specification can cause unrealistic pre-simulation results. This precise description of motion requires time- and computation-intensive calculations.

Thus, there is a need for a method for positioning a finite element occupant simulation model which prevents nodal penetrations and unrealistic behavior modeling.

SUMMARY OF THE INVENTION

The present invention provides a method for positioning a finite element occupant model within a pre-simulation that uses spring models to move the finite element occupant model from a starting position to a final position. Initially, a starting position and a final position for the finite element occupant model are determined. A first end of each of a plurality of spring models is attached to one or more components of the finite element occupant model in its starting position. The motion of the second end of each spring model is prescribed using positioning parameters and properties of each spring model are specified using spring parameters, such as spring stiffness, so that each attachment point is pulled to its final position through tension on the spring model. The specified positioning parameters and/or spring parameters describe how each spring model maneuvers the components of the finite element occupant model from the starting position to the final position.

For example, a first end of a spring model is connected to the upper arm of the finite element occupant model in the starting position and positioning parameters are specified describing how the second end of the spring model moves the upper arm of the finite element occupant simulation model from the starting position to the final position. Thus, the positioning parameters and/or spring parameters allow the spring models to manipulate finite element occupant simulation model components from the starting position to the final position, allowing repositioning of the finite element occupant simulation model without requiring precise specification of finite element occupant simulation model movement.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF THE INVENTION

A preferred embodiment of the present invention is now described with reference to the Figures where like reference numbers indicate identical or functionally similar elements. Also in the Figures, the left most digits of each reference number correspond to the Figure in which the reference number is first used.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process steps and instructions described herein in the form of an algorithm. It should be noted that the process steps and instructions of the present invention could be embodied in software, firmware or hardware, and when embodied in software, could be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the claims.

Figure 1:
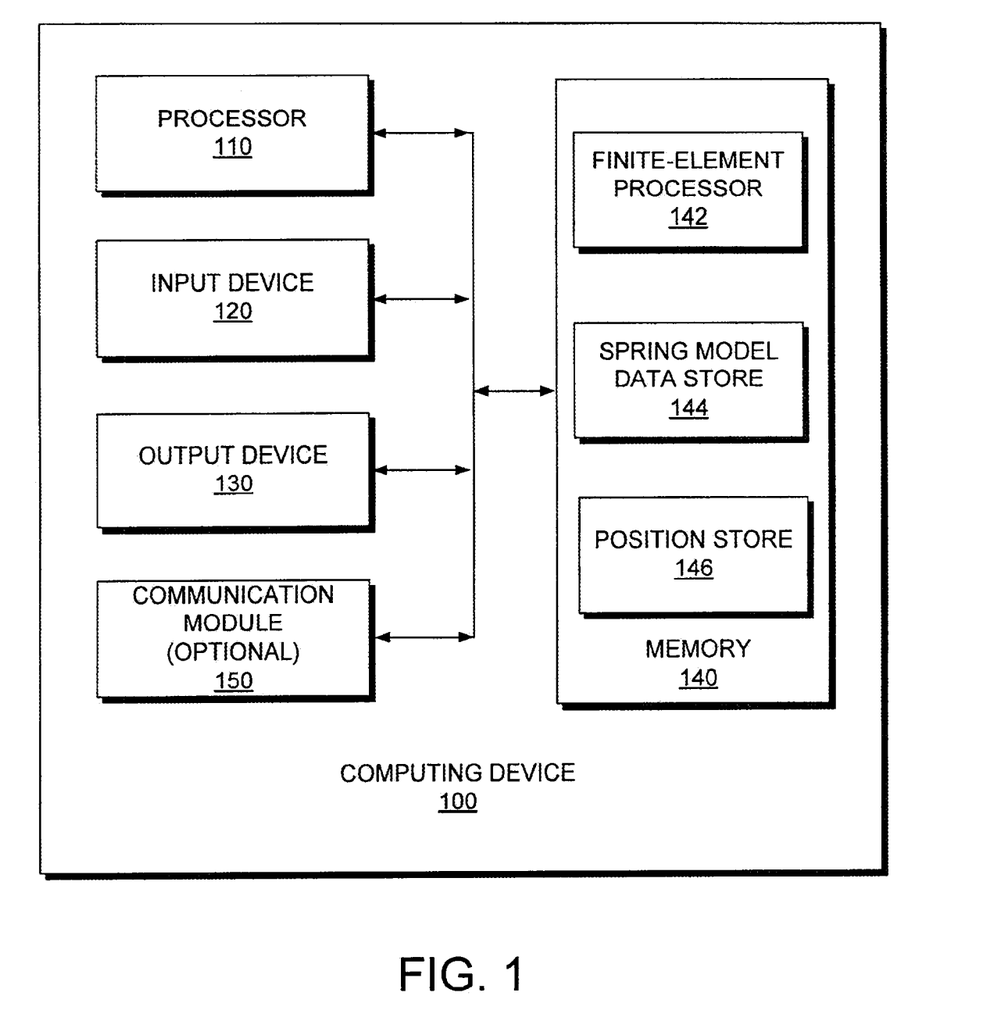
FIG. 1 is a block diagram of a computing device in which one embodiment of the present invention operates.

FIG. 1 is an illustration of a computing device 100 in which one embodiment of the present invention may operate. The computing device 100 comprises a processor 110, an input device 120, an output device 130 and a memory 140. In an embodiment, the computing device 100 further comprises a communication module 150 including transceivers or connectors.

The processor 110 processes data signals and may comprise various computing architectures including a complex instruction set computer (CISC) architecture, a reduced instruction set computer (RISC) architecture, or an architecture implementing a combination of instruction sets. Although only a single processor is shown in FIG. 1, multiple processors may be included. The processor 110 comprises an arithmetic logic unit, a microprocessor, a general purpose computer, or some other information appliance equipped to transmit, receive and process electronic data signals from the memory 140, the input device 120, the output device 130 or the communication module 150.

The input device 120 is any device configured to provide user input to the computing device 100 such as, a cursor controller or a keyboard. In one embodiment, the input device 120 can include an alphanumeric input device, such as a QWERTY keyboard, a key pad or representations of such created on a touch screen, adapted to communicate information and/or command selections to processor 110 or memory 140. In another embodiment, the input device 120 is a user input device equipped to communicate positional data as well as command selections to processor 110 such as a joystick, a mouse, a trackball, a stylus, a pen, a touch screen, cursor direction keys or other mechanisms to cause movement adjustment of an image.

The output device 130 represents any device equipped to display electronic images and data as described herein. Output device 130 may be, for example, an organic light emitting diode display (OLED), liquid crystal display (LCD), cathode ray tube (CRT) display, or any other similarly equipped display device, screen or monitor. In one embodiment, output device 120 is equipped with a touch screen in which a touch-sensitive, transparent panel covers the screen of output device 130.

The memory 140 stores instructions and/or data that may be executed by processor 110. The instructions and/or data may comprise code for performing any and/or all of the techniques described herein. Memory 140 may be a dynamic random access memory (DRAM) device, a static random access memory (SRAM) device, Flash RAM (non-volatile storage), combinations of the above, or some other memory device known in the art. The memory 140 comprises a classifier 142, a training corpus 144 and an extraction module 146, and is adapted to communicate with the processor 110, the input device 120, the output device 130 and/or the communication module 150.

The finite-element processor 142 provides information describing how to simulate the behavior of a finite-element model, such as a finite element occupant model. In one embodiment, the finite element processor 142 allows a user to specify a finite element occupant model and then applies one or more algorithms to simulate how the finite element occupant model behaves in different scenarios. For example, the finite element processor 142 allows configuration of a finite element occupant model to represent a vehicle occupant, such as a crash test dummy, a human or other type of vehicle occupant and subsequent simulation of how the finite element occupant model is affected by external forces, such as a vehicle accident. In one embodiment, the finite element processor 142 comprises a software process, or multiple software processes, such as the LS-DYNA finite element simulator from Livermore Software Technology Corporation or the ABAQUS finite element simulator from SIMULIA or another software process suitable for modeling the behavior of finite element models.

The spring model data store 144 includes data describing one or more spring model parameters. For example, the spring model data store 144 includes data describing the restoring force, the spring constant, the elastic limit, the spring stiffness, damping coefficients or additional parameters describing spring motion. In one embodiment, the spring model data store 144 is included in the finite element processor 142, for example comprising a data configuration module of the finite element processor 142. Alternatively, the spring model data store 144 comprises a discrete module including data describing the motion of one or more types of spring models.

The position store 146 includes data describing one or more finite element occupant model positions. For example, the position store 146 includes data describing finite element occupant model positioning for different types of crash tests, such as frontal impact tests, side impact tests, roll-over tests, offset tests, pedestrian impact tests or other types of destructive testing. Thus, the position store 146 includes data describing one or more finite element occupant model final positions, allowing different finite element occupant model positioning for different types of simulation. In one embodiment, the position store 146 also includes data describing an initial position of one or more finite element occupant models, allowing storage of how different types of finite element occupant models are initially positioned.

In an embodiment, the computing device 100 further comprises a communication module 150 which links the computing device 100 to a network (not shown), or to other computing devices 100. The network may comprise a local area network (LAN), a wide area network (WAN) (e.g. the Internet), and/or any other interconnected data path across which multiple devices man communicate. In one embodiment, the communication module 150 is a conventional connection, such as USB, IEEE 1394 or Ethernet, to other computing devices 100 for distribution of files and information. In another embodiment, the communication module 150 is a conventional type of transceiver, such as for infrared communication, IEEE 802.11a/b/g/n (or WiFi) communication, Bluetooth® communication, 3G communication, IEEE 802.16 (or WiMax) communication, or radio frequency communication.

It should be apparent to one skilled in the art that computing device 100 may include more or less components than those shown in FIG. 1 without departing from the spirit and scope of the present invention. For example, computing device 100 may include additional memory, such as, for example, a first or second level cache, or one or more application specific integrated circuits (ASICs). Similarly, computing device 100 may include additional input or output devices. In some embodiments of the present invention one or more of the components (110, 120, 130, 140, 142, 144, 146) can be positioned in close proximity to each other while in other embodiments these components can be positioned in geographically distant locations. For example the units in memory 140 can be programs capable of being executed by one or more processors 110 located in separate computing devices 100.

Figure 2:
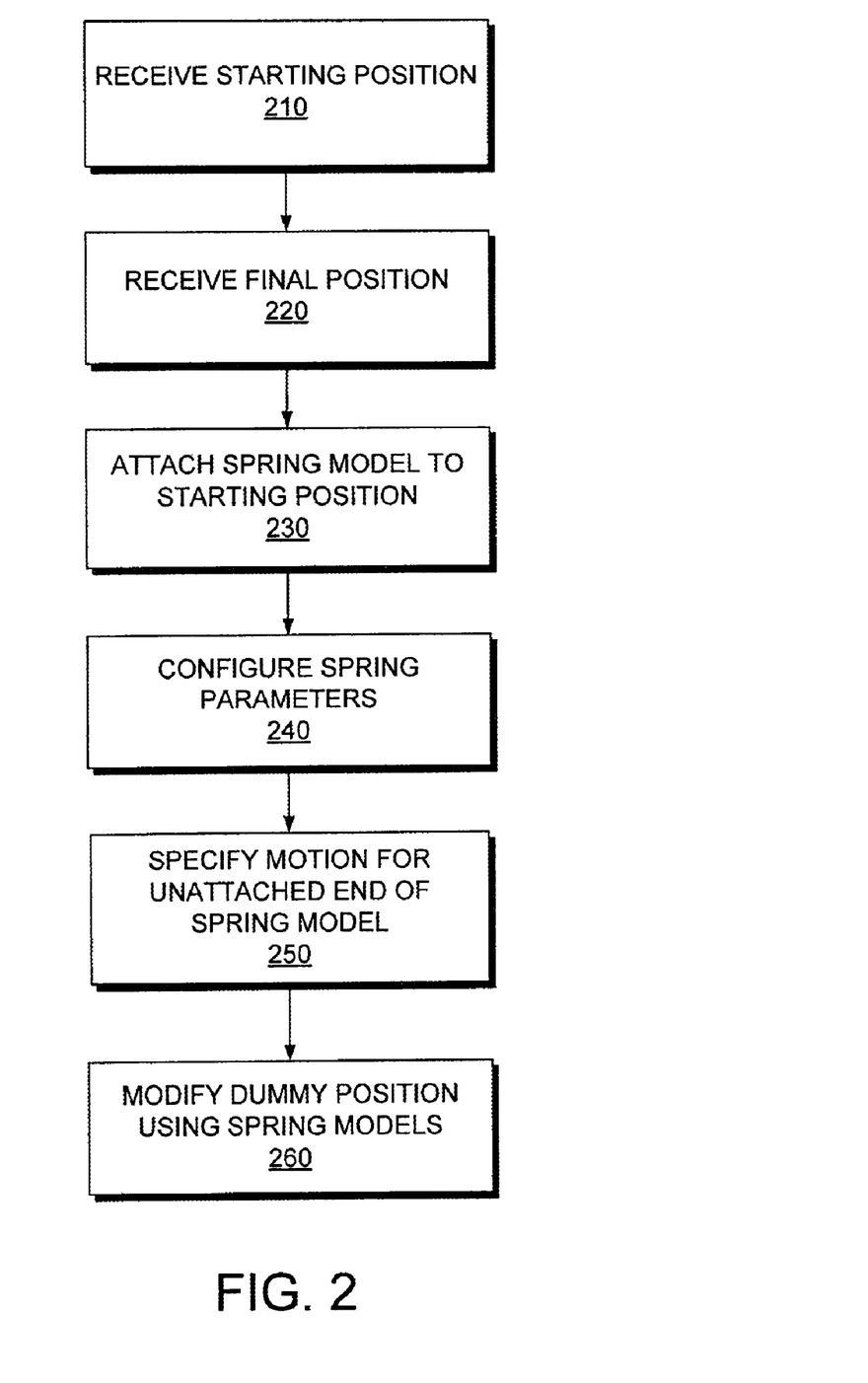
FIG. 2 is a flow chart of a method for determining finite element occupant model positioning according to one embodiment of the present invention.

FIG. 2 is a flow chart of a method for determining finite element occupant model positioning according to one embodiment of the present invention. In one embodiment, the steps of the method are implemented by the processor 110 executing instructions that cause the desired actions. Those of skill in the art will recognize that one or more of the method steps may be implemented in embodiments of hardware and/or software or combinations thereof. For example, instructions for performing the described actions are embodied or stored within a computer readable medium. Furthermore, those of skill in the art will recognize that other embodiments can perform the steps of FIG. 2 in different orders. Moreover, other embodiments can include different and/or additional steps than the ones described here.

Initially, a starting finite element occupant model position is received 210. In one embodiment, the starting finite element occupant model position is defined by a predefined set of data describing the physical position of a finite element occupant model. For example, the starting finite element occupant model position is provided by a finite element occupant model manufacturer or other source describing the position of various components of the finite element occupant model, such as a foot, a knee, an arm, a head, a hand, a leg, and/or a torso. Hence, the starting finite element occupant position describes the position of a finite element occupant model without initial penetrations.

A final position for the finite element occupant simulation model is then received 220. This final position represents the desired position of the finite element occupant model for simulation purposes. In one embodiment, a scan of a physical vehicle occupant, such as a human or a crash test dummy, is received from a coordinate measuring machine or other device identifying the location of various vehicle occupant components, such as vehicle occupant shoulders, torso, head, arm, knee, leg or other components. In one embodiment, the scan of the physical vehicle occupant is reformatted and imported into the finite-element processor 142. In one embodiment, the scan of the physical vehicle occupant is also modified, such as by translating and/or rotating the finite element occupant simulation model's hip point, to reposition the finite element occupant simulation model to further refine simulation of the vehicle occupant position.

In one embodiment, the final position comprises a position based on crash test standards, such as a position specified by governmental, or other, specifications or regulations. Alternatively, the final position comprises a position for evaluating a specific type of accident or analyzing how a specific component of the finite element occupant model is affected by an accident. In one embodiment, the final position is selected from positional data included in the position store 146.

Spring models are then attached 230 to one or more components of the finite element occupant model in the starting position. A first end of each spring model is attached to a component of the finite element occupant model in the starting position, while a second end of each spring model is unattached. In one embodiment, spring models are attached 230 to one or more components of the finite element occupant model such as feet, knees, wrists, forearms or other movable components. For example, an input is received to select components on the finite element occupant model and a first end of a spring model is attached 230 to the selected components.

After attaching 230 the first end of one or more spring models to the finite element occupant model in the starting position, spring parameters of the spring models are configured 240. The spring parameters describe characteristics of the one or more spring models affecting movement of one or more of the finite element occupant model components. For example, a spring stiffness parameter is modified so that the final position of the finite element occupant model closely matches a final position of a physical finite element occupant model prior to a crash test. Modification of the spring stiffness parameter affects the rate of motion of the finite element occupant model attached to the spring, allowing the spring stiffness parameter to modify how rapidly the finite element occupant components are moved from the initial position to the final position.

One or more positioning parameters are then specified 250 for the second end of the spring model, which is not attached to the finite element occupant model in the starting position. The specified positioning parameters describe how the spring models pull components of the finite element occupant model from the starting position to the final position. This simplifies repositioning of the finite element occupant simulation model by using properties of the spring model motion to perform the repositioning, allowing accurate repositioning of the finite element occupant model without requiring precise description of how to move individual components of the finite element occupant model from the starting position to the final position. Using spring models allows repositioning of components of the finite element model without over-constraining the motion of the finite element model components.

Hence, using the attached spring models to reposition the finite element occupant model establishes boundary conditions for finite element occupant model motion, which can subsequently be used by a simulation engine, such as the LS-DYNA finite element simulator from Livermore Software Technology Corporation or the ABAQUS finite element simulator from SIMULIA or another software process suitable for modeling the behavior of finite element models. The simulation engine uses the boundary conditions provided by the spring models to reposition a finite element occupant model by allowing contact algorithms within the simulation engine to ensure that no nodal penetrations occur during motion pre-simulation. Using spring models loosely constrains the relative motion of different finite element occupant model components, preventing over-constraining of motion during the pre-simulation. Therefore, use of the spring models allows accurate repositioning of the finite element occupant model while also allowing a simulation engine to accurately model motion without becoming over-constrained.

After configuring 240 the spring parameters and specifying 250 one or more positioning parameters for the unattached second end of the spring model, the spring parameters and positioning parameters are used in a finite element simulation to modify 260 the finite element occupant model position. Based on the spring parameters and the positioning parameters, the spring models move finite element occupant model components from the starting position to the final position. For example, the spring parameters pull, rotate or otherwise manipulate one or more components of the finite element occupant model within a pre-simulation to re-orient the finite element occupant model position without causing nodal penetrations while accurately approximating component movement. Hence, the spring models move the finite element occupant model components into a different position, allowing efficient, but simple, repositioning of a finite element occupant model from a starting position to various final positions. This repositioning via pre-simulation allows the finite element occupant model to be used in a subsequent simulation engine to accurately simulate occupant behavior in various accident scenarios.

Figure 3:
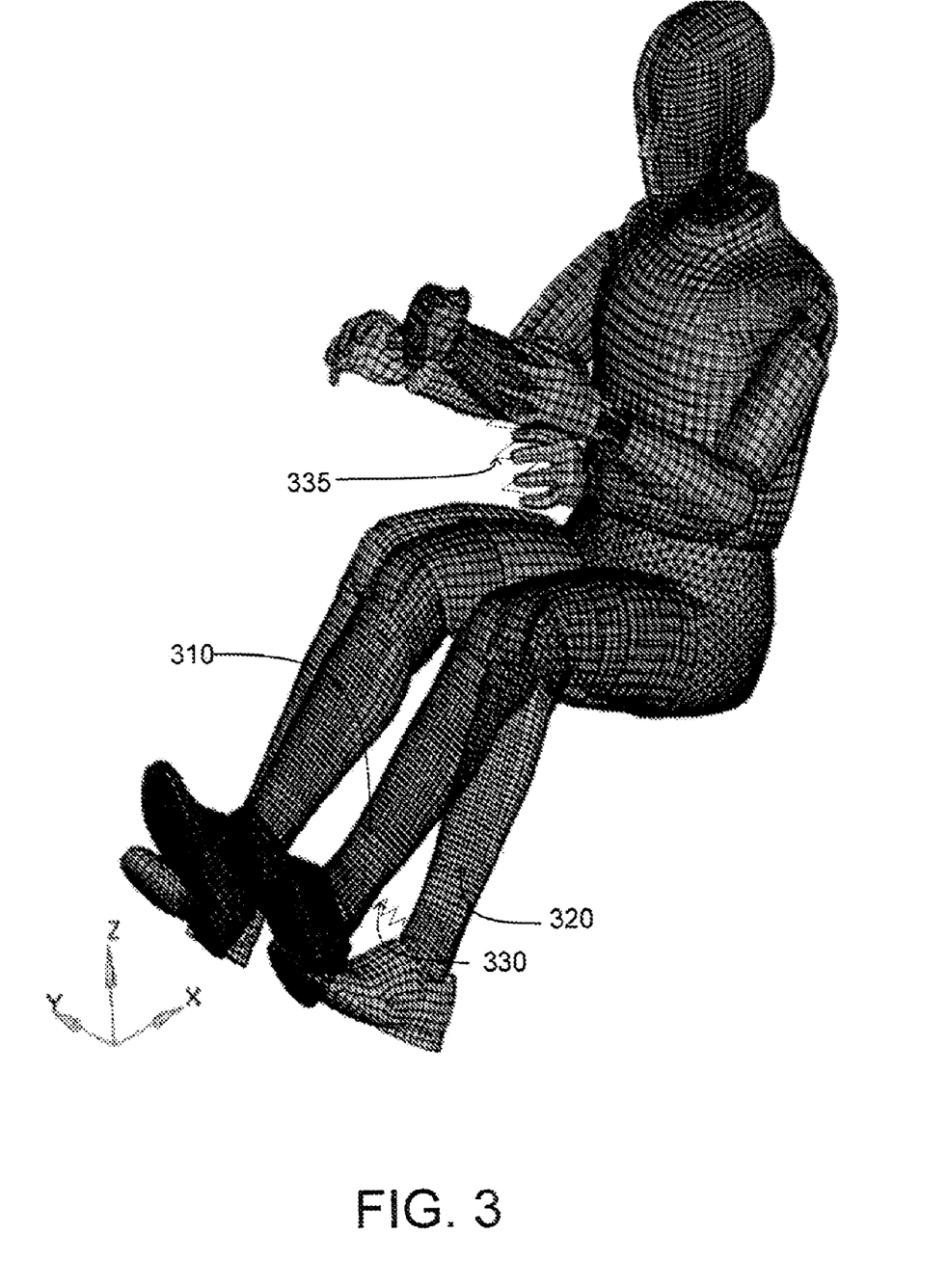
FIG. 3 is an example of repositioning a finite element occupant model from a starting position to a final position according to one embodiment of the present invention.

FIG. 3 is an example of using spring models to repositioning a finite element occupant model from a starting position to a final position according to one embodiment of the present invention.

A starting position 310 and a final position 320 for the finite element occupant model are initially selected or determined. In various embodiments, the final position 320 corresponds to a position that is applicable to, or used for, a particular type of crash test, such as a front end collision test, a side impact test or other type of destructive test. A first end of each of plurality of spring models 330, 335 is then attached to the finite element occupant model in the starting position while the second end of each of the plurality of spring models 330, 335 is unattached. Spring parameters and positioning parameters are then defined. These motion parameters and positioning parameters specify characteristics of the spring model, such as how the spring model deforms when tension is applied. Hence, the spring parameters and positioning parameters specify how the spring model moves one or more components of the finite element model attached to the first end of the spring model into the final position 320.

For purposes of illustration, FIG. 3 shows two spring models 330, 335 attached to different finite element occupant model components in the starting position 310. The spring models 330, 335 reposition the attached components into the final position 320. For example, a first spring model 335 attached to the finite element occupant model's hand in the starting position 310 repositions the finite element occupant model's hand into the final position 320 according to the spring parameters and positional parameters. Similarly, a second spring model 330 attached to the finite element occupant model's foot in the starting position 310 repositions the finite element occupant model's foot into the final position 320 according to specified spring parameters and positional parameters.

The spring models 330, 335 reposition finite element occupant model components from the starting position 310 to the final position 320. In one embodiment, based on the spring parameters and positioning parameters, properties of the spring models 330, 335 pull the finite element occupant model components from the starting position 310 to the final position 320. Using spring models 330, 335 loosely constrains the relative motion of various finite element occupant model components. By loosely constraining the motion of different finite element occupant model components, pre-simulation of the finite occupant model movement is not over-constrained. Pre-simulating prevents nodal penetration of the finite element occupant model components and increases the accuracy of a simulation using the finite element occupant model.

For purposes of illustration, FIG. 3 shows two spring models 330, 335 attached to different finite element occupant model components in the starting position 310. The spring models 330, 335 reposition the attached components into the final position 320. For example, a first spring model 335 attached to the finite element occupant model's hand in the starting position 310 repositions the finite element occupant model's hand into the final position 320 according to the spring parameters and positional parameters. Similarly, a second spring model 330 attached to the finite element occupant model's foot in the starting position 310 repositions the finite element occupant model's foot into the final position 320 according to specified spring parameters and positional parameters.

The spring models 330, 335 reposition finite element occupant model components from the starting position 310 to the final position 320. In one embodiment, based on the spring parameters and positioning parameters, properties of the spring models 330, 335 pull the finite element occupant model components from the starting position 310 to the final position 320. Using spring models 330, 335 loosely constrains the relative motion of various finite element occupant model components. By loosely constraining the motion of different finite element occupant model components, pre-simulation of the finite occupant model movement is not over-constrained. Pre-simulating prevents nodal penetration of the finite element occupant model components and increases the accuracy of a simulation using the finite element occupant model.

Hence, the spring models 330, 335 allow for accurate repositioning of the finite element occupant model without requiring exact calculation of individual finite element occupant model components. The components are repositioned from starting position 310 to final position 320. Additionally, modifying spring parameters and/or positioning parameters allows the spring models 330, 335 to reposition different types of finite element occupant models, such as those representing a crash test dummy or a human, without requiring recalculation of individual movements of finite element occupant model components to account for different types of vehicle occupants.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claim.

What is claimed is:

1. A computer-based method for positioning a finite element occupant model including a plurality of components, the method comprising the steps of:
   receiving a starting position of the finite element occupant model in a pre-crash simulation;
   receiving an ending position of the finite element occupant model in a pre-crash simulation;
   associating one or more spring models with the starting position of the finite element occupant model so that a first end of each spring model is attached to a component of the finite element occupant model in the starting position;
   defining spring parameters associated with each spring model, the defined spring parameters describing characteristics of the spring models affecting movement of one or more components during the pre-crash simulation and comprising one or more parameters describing motion of a second end of each spring model and one or more parameters describing a response of each spring model to tension; and
   responsive to the spring parameters associated with the spring models, moving the one or more components during the pre-crash simulation from the starting position to the ending position to position the finite element occupant; and using, for a crash-simulation starting position of the finite element occupant in a crash simulation, the pre-crash simulated ending position of the finite element occupant.

2. The method of claim 1, wherein moving the one or more components during the pre-crash simulation from the starting position to the ending position to position the finite element occupant comprises the steps of:
   applying tension to the one or more spring models according to the spring parameters; and
   responsive to the tension applied to the one or more spring models, moving the one or more components in a path constrained by the spring models.

3. The method of claim 2, wherein moving the one or more components during the pre-crash simulation from the starting position to the ending position to position the finite element occupant further comprises:
   responsive to the tension applied to the one or more spring models, deforming the one or more spring models as specified by the spring parameters.

4. The method of claim 1, wherein the ending position of the finite element occupant model in a pre-crash simulation is associated with a position described by predefined positional data.

5. The method of claim 1, wherein the crash-simulation starting position of the finite element occupant model is used to simulate a type of vehicle accident.

6. The method of claim 5, wherein the type of vehicle accident comprises a frontal impact, a side impact, a roll-over, an offset or a pedestrian impact.

7. The method of claim 1, wherein the plurality of components of the finite element occupant model comprise a foot, a knee, an arm, a head, a hand, a leg and a torso.

8. A computer program product, comprising a non-transitory computer readable storage medium storing computer executable code for positioning a finite element occupant model including a plurality of components, the computer executable code performing the steps of:
   receiving a starting position of the finite element occupant model in a pre-crash simulation;
   receiving an ending position of the finite element occupant model in a pre-crash simulation;
   associating one or more spring models with the starting position of the finite element occupant model so that a first end of each spring model is attached to a component of the finite element occupant model in the starting position;
   defining spring parameters associated with each spring model, the defined spring parameters describing characteristics of the spring models affecting movement of one or more components during the pre-crash simulation and comprising one or more parameters describing motion of a second end of each spring module and one or more parameters describing a response of each spring model to tension; and
   responsive to the spring parameters associated with the spring models, moving the one or more components during the pre-crash simulation from the starting position to the ending position to position the finite element occupant; and using, for a crash-simulation starting position of the finite element occupant in a crash simulation the pre-crash simulated ending position of the finite element occupant.

9. The computer program product of claim 8, wherein moving the one or more components during the pre-crash simulation from the starting position to the ending position to position the finite element occupant comprises the steps of:
   applying tension to the one or more spring models according to the spring parameters; and
   responsive to the tension applied to the one or more spring models, moving the one or more components in a path constrained by the spring models.

10. The computer program product of claim 9, wherein moving the one or more components during the pre-crash simulation from the starting position to the ending position to position the finite element occupant further comprises:

responsive to the tension applied to the one or more spring models, deforming the one or more spring models as specified by the spring parameters.

11. The computer program product of claim 8, wherein the ending position of the finite element occupant model in a pre-crash simulation is associated with a position described by predefined positional data.

12. The computer program product of claim 8, wherein the crash-simulation starting position of the finite element occupant model is used to simulate a type of vehicle accident.

13. The computer program product of claim 12, wherein the type of vehicle accident comprises a frontal impact, a side impact, a roll-over, an offset or a pedestrian impact.

14. The computer program product of claim 8, wherein the plurality of components of the finite element occupant model comprise a foot, a knee, an arm, a head, a hand, a leg and a torso.

\* \* \* \* \*